(12) United States Patent
Azuma et al.

(10) Patent No.: US 6,664,115 B2
(45) Date of Patent: Dec. 16, 2003

(54) METAL INSULATOR STRUCTURE WITH POLARIZATION-COMPATIBLE BUFFER LAYER

(75) Inventors: Masamichi Azuma, Osaka (JP); Carlos A. Paz de Araujo, Colorado Springs, CO (US)

(73) Assignees: Symetrix Corporation, Colorado Springs, CO (US); Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/899,670

(22) Filed: Jul. 5, 2001

(65) Prior Publication Data

US 2003/0207470 A1 Nov. 6, 2003

Related U.S. Application Data

(63) Continuation-in-part of application No. 07/965,190, filed on Oct. 23, 1992, now abandoned, and a division of application No. 08/517,036, filed on Aug. 21, 1995, now Pat. No. 6,310,373.

(51) Int. Cl.[7] .......................... H01L 21/00; H01L 21/31; H01L 21/336
(52) U.S. Cl. .......................... 438/3; 438/778; 438/785; 438/287
(58) Field of Search .......................... 438/3, 287, 591, 438/778, 785, 216

(56) References Cited

U.S. PATENT DOCUMENTS

| | | | | |
|---|---|---|---|---|
| 3,893,148 A | * | 7/1975 | Madjid .......................... | 257/28 |
| 4,088,515 A | * | 5/1978 | Blakeslee et al. .............. | 117/91 |
| 4,259,365 A | * | 3/1981 | Ruppel et al. .................. | 438/3 |
| 4,707,897 A | | 11/1987 | Rohrer et al. | |
| 4,952,527 A | * | 8/1990 | Calawa et al. .............. | 438/167 |
| 4,959,694 A | * | 9/1990 | Gell .......................... | 257/13 |
| 5,021,839 A | | 6/1991 | Yamazaki | |
| 5,043,049 A | * | 8/1991 | Takenaka ............... | 204/192.15 |

(List continued on next page.)

FOREIGN PATENT DOCUMENTS

| | | |
|---|---|---|
| EP | 0 540 993 A1 | 10/1992 |
| EP | 0 540 933 | 5/1993 |
| WO | WO 91/13465 | 9/1991 |
| WO | WO 93/12542 | 6/1993 |
| WO | WO 94/10084 | 5/1994 |

OTHER PUBLICATIONS

Smolenskii et al., "Dielectric Polarization of a Number of Complex Compounds", Oct. 1959, Fizika Tverdogo Tela vol. 1, No. 10, pp. 1562–1572 (translation pp. 1429–1437).*

Smolenskii et al., "Ferroelectrics of the Oxygen–Octahedral Type with Layered Structure", Sep. 1961, Soviet Physic—Solid State, vol. 3, No. 3, pp. 651–655.*

(List continued on next page.)

Primary Examiner—Matthew Smith
Assistant Examiner—Lex H. Malsawma
(74) Attorney, Agent, or Firm—Patton Boggs LLP

(57) ABSTRACT

An MIS device (20) includes a semiconducting substrate (22), a silicon nitride buffer layer (24), a ferroelectric metal oxide superlattice material (26), and a noble metal top electrode (28). The layered superlattice material (26) is preferably a strontium bismuth tantalate, strontium bismuth niobate, or strontium bismuth niobium tantalate. The device is constructed according to a preferred method that includes forming the silicon nitride on the semiconducting substrate prior to deposition of the layered superlattice material. The layered superlattice material is preferably deposited using liquid polyoxyalkylated metal organic precursors that spontaneously generate a layered superlattice upon heating of the precursor solution. UV exposure during drying of the precursor liquid imparts a taxis orientation to the final crystal, and results in improved thin-film electrical properties.

7 Claims, 5 Drawing Sheets

U.S. PATENT DOCUMENTS

| | | | | |
|---|---|---|---|---|
| 5,241,191 A | | 8/1993 | Agostinelli et al. | |
| 5,310,990 A | * | 5/1994 | Russell et al. | 219/121.69 |
| 5,313,089 A | * | 5/1994 | Jones, Jr. | 257/295 |
| 5,316,579 A | * | 5/1994 | McMillan et al. | 118/50 |
| 5,326,721 A | * | 7/1994 | Summerfelt | 438/3 |
| 5,378,905 A | * | 1/1995 | Nakamura | 257/213 |
| 5,405,796 A | * | 4/1995 | Jones, Jr. | 438/3 |
| 5,423,285 A | * | 6/1995 | Paz de Araujo et al. | 117/90 |
| 5,426,075 A | | 6/1995 | Perino et al. | |
| 5,439,845 A | * | 8/1995 | Watanabe et al. | 438/396 |
| 5,461,243 A | * | 10/1995 | Ek et al. | 257/190 |
| 5,468,684 A | * | 11/1995 | Yoshimori et al. | 438/3 |
| 5,478,610 A | * | 12/1995 | Desu et al. | 427/573 |
| 5,508,226 A | * | 4/1996 | Ito et al. | 427/79 |
| 5,514,484 A | | 5/1996 | Nashimoto | |
| 5,514,822 A | * | 5/1996 | Scott et al. | 556/28 |
| 5,519,234 A | * | 5/1996 | Paz de Araujo et al. | 257/295 |
| 5,519,566 A | | 5/1996 | Perino et al. | |
| 5,567,979 A | * | 10/1996 | Nashimoto et al. | 257/627 |
| 5,578,845 A | * | 11/1996 | Masuda et al. | 257/295 |
| 5,579,258 A | * | 11/1996 | Adachi | 365/145 |
| 5,650,362 A | * | 7/1997 | Nashimoto | 427/126.3 |
| 5,738,721 A | * | 4/1998 | Barron et al. | 117/104 |

OTHER PUBLICATIONS

Melnick et al, "Characterization Of An N–Channel 1T–1C Nonvolatile Memory Cell Using Ferroelectric SrBi2Ta2O9 As The Capacitor Dielectric," Seventh International Symposium On Integrated Ferroelectrics, vol. 11 ( No. 1–4), p. 145–160 (Mar. 20, 1995).

P. Arnett, "Ferroelectric FET Device," IBM Technical Disclosure Bulletin, vol. 15 ( No. 9), p. 2825 (Feb., 1973).

Hirau et al., "Characterization Of Metal/Ferroelectric/Insulator/ Semiconductor Structure With CeO2 Buffer Layer," Jpn. J. Appl. Phys., p. 1163–1166 (Aug., 1995).

Nakamura et al., "Preparation Of Pb(Zr,Ti)O3 Thin Films On Ir And IrO2 Electrodes," Jpn. J. Appl. Phys., p. 5207–5210 (1994).

Auciello et al., "The Physics Of Ferroelectric Memories," Physics Today, American Institute Of Physics, p. 22–27 (Jul., 1998).

Moulson et al., "Electroceramics—Materials—properties—applications," Chapman And Hall, p. 243–244 (1990).

* cited by examiner

METAL INSULATOR STRUCTURE WITH POLARIZATION-COMPATIBLE BUFFER LAYER

RELATED APPLICATIONS

This application is a continuation-in-part of U.S. application Ser. No. 07/965,190 filed Oct. 23, 1992, abandoned, and is a divisional application of application Ser. No. 08/517,036 filed Aug. 21, 1995, now U.S. Pat. No. 6,310,373.

BACKGROUND OF THE INVENTION

1. Field of the Invention

The present invention pertains to the field of thin-film integrated circuit components, and, more specifically, to metal insulator semiconductors ("MIS") devices. Still more particularly, the MIS devices contain a ferroelectric material as the insulator.

2. Description of the Prior Art

Ferroelectric materials can be used as a gate insulator of metal oxide semiconductor field effect transistor ("MOSFET") devices. In this application, the spontaneous polarization serves to modulate the gate-channel conduction. The channel conduction state can, for example, be utilized as an indicator of a memory storage state. Silicon substrates are the most commonly used types of substrates for these applications. A problem exists because the ferroelectric polarization phenomenon is greatly reduced or even completely dissipated when the ferroelectric materials are deposited directly on the silicon surface. This reduction in ferroelectric polarization can be observed as the distance between positive and negative direction switching curves on a hysteresis plot of capacitance versus bias voltage. A very small separation between the positive and negative switching curves will indicate a correspondingly small ferroelectric polarization. Conversely, a large separation indicates a correspondingly large polarization.

Metal oxide ferroelectric materials have traditionally required firing or annealing at very high temperatures to provide a lattice structure that is capable of exhibiting ferroelectric polarization. These high firing temperatures induce diffusion of compounds between adjacent thin-film layers. One aspect of this diffusion is thought to be the production of a low dielectric layer that is formed between the ferroelectric material and the silicon substrate. This low dielectric layer acts as a parasitic capacitor and screens the applied electric field by producing a surface charge that reduces the ability of the applied electric field to reach the ferroelectric material. The screening effect reduces the magnitude of polarization obtainable from the ferroelectric material. The parasitic ferroelectric capacitor effect varies with the applied field and, consequently, the amount of screening or effective field-drop across the ferroelectric capacitor varies with the applied field.

Prior attempts at producing MIS devices using a ferroelectric material as the insulator have produced devices having capacitance versus voltage curves that present numerous problems. As indicated above, a primary problem is a reduction in the ferroelectric polarization phenomenon, which may be completely dissipated. Another problem is that the capacitance versus voltage curves rise at a low angle, not a steep one. This low angle indicates switching of the material over a very wide voltage range. The low-angle rise makes it possible to partially switch the polarization state of the ferroelectric material with cumulative effect due to noise. Electronic memories containing low-angle rise ferroelectric materials would, therefore, be subject to noise-induced read errors. Of course, the lack of any polarization at all would make it impossible to use the material in a non-destructive readout MOSFET ferroelectric memory where the polarization state controls the gate current.

SUMMARY OF THE INVENTION

The present invention overcomes the above-identified problems by providing an improved ferroelectric MIS device ("MFS or MFIS device") that may be used in electronic memories. The improvements include capacitance versus voltage curves having a wide separation based on the polarization state of the ferroelectric material and the switching direction. Additionally, the capacitance versus voltage curves rise steeply to make the MIS device less sensitive to noise.

The MIS device includes a semiconducting substrate having a perovskite-like metal oxide layered superlattice material deposited thereon and an electrode formed above the layered superlattice material. Additionally, a buffer layer is interposed between the layered superlattice material and the semiconducting substrate, and the buffer layer may be capped with a silicon dioxide layer.

Preferred exemplary forms of the invention include the semiconducting substrate being formed of n-doped or p-doped silicon. The layered superlattice material is preferably a room-temperature ferroelectric composition made of strontium bismuth tantalate, strontium bismuth niobate, or strontium bismuth niobium tantalate. Other preferred ferroelectric compositions include those just mentioned in combination with a vanadium or tungsten moiety. The layered superlattice material preferably has a C-axis orientation that can be obtained by drying providing a liquid precursor having a plurality of metal moieties in effective amounts for yielding a layered superlattice material, applying the precursor to a substrate, drying the precursor in the presence of ultraviolet ("UV") radiation, and annealing the dried precursor.

The device exhibits an extremely high level of ferroelectric capacitance versus voltage behavior. Results indicate that films of thicknesses less than 3000 Å or even 2000 Å have a window of separation between the steeply rising positively and negatively switched capacitance curves exceeding five volts.

Other salient features, objects, and advantages of the present disclosure will be apparent to those skilled in the art upon a reading of the disclosure below and a review of the corresponding drawings.

DETAILED DESCRIPTION OF THE INVENTION

Figure 1:
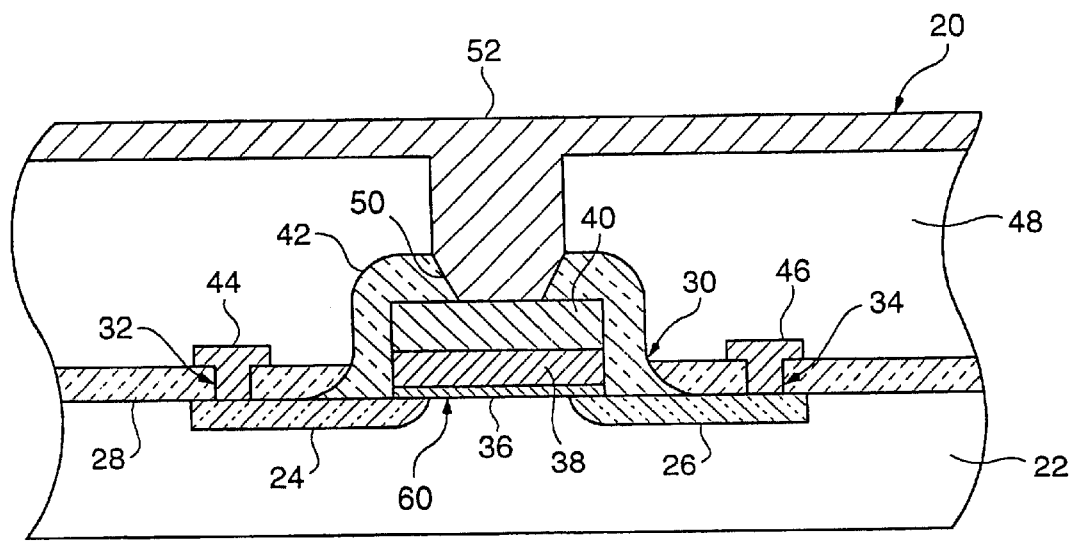
FIG. 1 depicts an MIS device having a gate formed of ferroelectric layered superlattice material and a buffer layer deposited on a semiconducting substrate.

FIG. 1 depicts a first embodiment of the present invention, i.e., ferroelectric MOSFET device 20. Device 20 includes substrate 22, which is preferably formed of n or p-doped silicon or, more preferably, n-doped silicon. Conventional silicon technology p-dopants include boron, aluminum, gallium, and indium. Conventional n-dopants include phosphorous, arsenic, and antimony. Source/drain regions 24 and 26 are n-doped or p-doped silicon. Regions 24 and 26 are n-doped when substrate 22 is p-doped. Conversely, regions 24 and 26 are p-doped when substrate 22 is n-doped. Substrate 22 may also be formed of other known substrate materials, such as gallium arsenide, sapphire, and quartz. This discussion will concentrate on silicon technology devices, but those skilled in the art will understand its applicability to other types of substrates.

An isolation layer 28 is preferably formed over substrate 22. This layer is preferably formed of silicon dioxide, which may be a thermally grown oxide or one of the commercially available varieties of spin-on glass. Layer 28 is removed in the respective regions of contact holes 30, 32, and 34.

Buffer layer 36 is preferably formed atop substrate 22 in the center of contact hole 30. The preferred materials for buffer layer 36 include silicon nitride and titanium nitride, with silicon nitride being most preferred. Layer 36 is used to compensate for surface irregularities on substrate 22. These irregularities may include thermally induced features, such as cracks or roughness, as well as point-charge defects in the substrate lattice. Surface charge defects in substrate 22 can be especially problematic in ferroelectric devices because these defects have a field-screening effect that reduces the magnitude of an applied field passing through substrate 22. The use of silicon or titanium nitride is preferred because these nitrides also serve to prevent the interlayer diffusion of contaminants between adjacent thin films. Specifically, layer 36 prevents upward diffusion of doped silicon moieties from substrate 22. This type of diffusion can produce a multitude of charge traps that will, in the absence of layer 36, significantly impair the electrical stability of the gate region.

Ferroelectric gate layer 38 is positioned atop buffer layer 36. Ferroelectric layer 38 is preferably a ferroelectric metal oxide layered superlattice material. The term "layered superlattice material" is used herein because no well-defined accepted term exists in the art to describe these type of materials. Layered superlattice materials at least include all three of the Smolenskii-type ferroelectric layered superlattice materials, namely, those having the respective average empirical formulae:

  (1)

  (2)

  (3)

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number in the overall formula, the formula typically provides for a plurality of different or mixed perovskite-like layers each having a different integer value. These mixed layered superlattice materials actually comprise a plurality or mixture of perovskite-like layers having integer m values according to Formula (4) below. The separate layers spontaneously generate from solution and do not require separate deposition steps. The A-site metals and B-site metals may include mixtures of cations having similar ionic radii.

In layered superlattice materials according to Formula (1), thermodynamics favor the formation of oxygen octahedra structures in layers having a thickness of m octahedra according to the formula

  (4)

wherein m is an integer greater than one and the other variables are defined above. These layers are separated by bismuth oxide layers having the formula

  (5)

wherein Bi is S of Formula (1).

The superlattice-generator layers, S, include oxides of bismuth (III), and may also include other similarly sized trivalent metal cations such as thallium (III). Bismuth also functions as an A-site metal in the perovskite-like lattice if it is present in excess of the stoichiometrically required amount for generating the layered superlattice material according to Formula (I). The most preferred layered superlattice materials include strontium bismuth tantalate, strontium bismuth niobate, and strontium bismuth niobium tantalate. Additionally, it can be advantageous to provide these materials with a mixture B-site elements including vanadium and tungsten.

Top electrode 40 is preferably formed of a noble metal. Platinum is the most preferred metal. A top insulator coating 42 covers electrode 40, and is preferably silicon dioxide. Metal source/drain leads 44 and 46 are respectively received within the corresponding contact holes 32 and 34, and contact source/drain regions 24 and 26. Leads 44 and 46 are most preferably made of platinum metal. A second oxide coat 48 is formed over oxide layer 42 and leads 44–46. Contact hole 50 is formed through oxide coat 48 to permit wiring layer 52 to contact layer 40. Layer 52 is preferably made of platinum or aluminum.

Device 20 operates as a MOSFET memory cell having a nondestructive readout capability. Ferroelectric gate layer 38 will either have a positively or negatively switched polarization state that is associated with a corresponding field. This field prevents current from traveling across gate layer 38 from, for example, lead 46 to lead 44 when, the voltage or potential difference between leads 46 and 44 is below a maximum cutoff value. This maximum cutoff value is preferably six volts or less and more preferably from three to five volts. Once switching of layer 38 has been accomplished, the voltages in all of the metalization layers (40, 44, 46, and 52) can be relaxed without altering the gate modulation state of transistor 20. In particular, the polarization state of gate layer 38 will remain indefinitely until such time as another applied field across layer 38 induces switching. In the other polarization state, e.g., a negatively switched state, ferroelectric gate layer 38 lacks a sufficient field to prevent the travel of current across layer 38 from, for example, lead 46 to lead 44 when the voltage difference is below the maximum cutoff value. Thus, device 20 operates as a memory storage cell having a "zero" value when current can pass from lead 46 to lead 44 and a "one" value when current is prohibited from passage. Switching of the ferroelectric polarization state can consume or release charge. The use of a layered superlattice material for ferroelectric layer 38 permits the long-term retention of a given polarization state for many days, weeks, or longer periods of time. Continuous short-interval refreshment (e.g., microsecond intervals as in the case of dynamic random access memories) of the memory storage state is, accordingly, not required.

Polarization switching of the material in ferroelectric gate layer 38 be accomplished by creating a voltage differential across layer 38 to provide a corresponding applied field that is capable of switching the polarization state of the thin-film layered superlattice material. The voltage difference can be caused by raising the voltage in wiring layer 52 relative to leads 44 and 46 to a sufficient value for switching of layer 38. Switching can also be accomplished by raising the voltage in leads 44 and 46 relative to wiring layer 52. Where the respective metalization layers have voltages that are large enough to cause switching if applied across layer 38, switching can also be accomplished by dropping the voltage in the respective metalization layers (40, 44, 46, and 52) to place a coercive switching field across layer 38.

Figure 2:
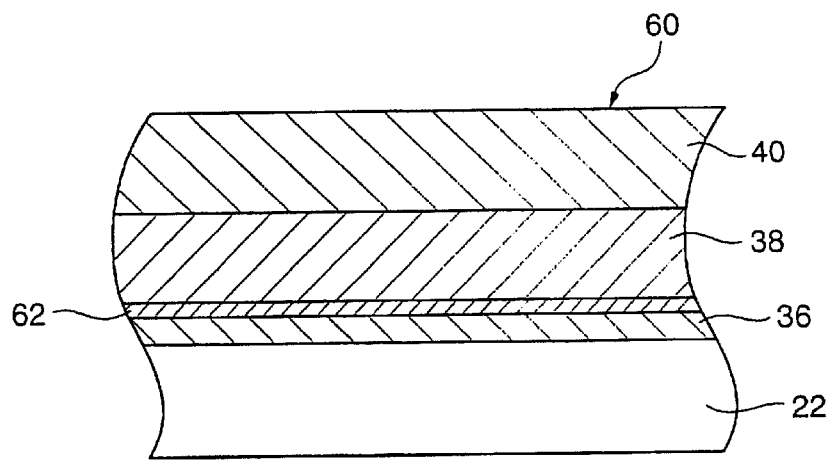
FIG. 2 depicts the gate device of FIG. 1 in more detail.

FIG. 2 depicts a second embodiment of the present invention, i.e., metal ferroelectric semiconductor ("MFS") device 60. Device 60 is essentially the same as the transistor gate layers 60 that are found within contact hole 30 of FIG. 1 and, consequently, the layers of FIG. 2 have retained identical numbering with respect to FIG. 1. Device 60 can be used in other circuit applications in addition to the embodiment of device 20. The use of buffer layer 36 is preferred because it provides a dramatic improvement in the polarization characteristics of ferroelectric layer 38. The most preferred application of device 60 is as a MOSFET gate (see FIG. 1), however, the essential elements of device 60 can be used in other applications.

An oxidation phenomenon can occur during the manufacturing process for device 60 in which the side of the silicon nitride layer 36 closest to the ferroelectric layer 38 is oxidized during the oxygen anneal process for the dried strontium bismuth tantalate precursor solution. The resultant formation of a thin silicon dioxide oxide layer 62 is undesirable, but sometimes unavoidable. A layer 62 that is formed in this manner can act as a parasitic capacitor, however, the actual parasitic effect is negligible. The effect of this thin film is of more consequence when it is desired to orient the ferroelectric layer 38 by exposure to radiation during the manufacturing process. Accordingly, when the growth of ferroelectric layer 38 will be oriented by radiation exposure, it is preferred to enhance the uniformity of layer 62 by forming a layer 62 of silicon. Layer 62 is preferably formed by oxidizing the silicon nitride surface layer with a thirty minute anneal at 850° C. in an $O_2$ atmosphere.

Figure 3:
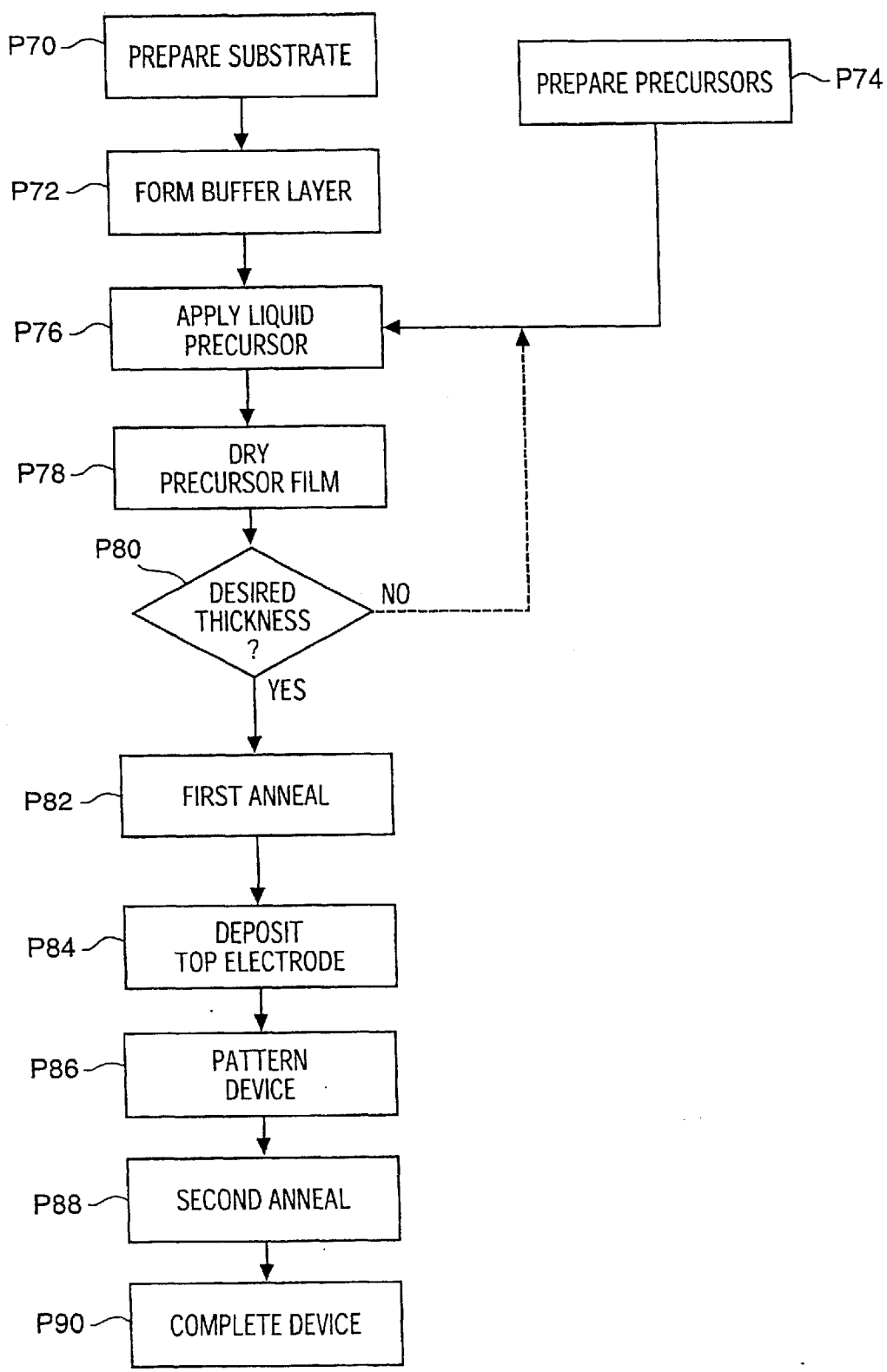
FIG. 3 is a process-flow chart diagram depicting a process for manufacturing the MIS device of FIG. 1.

FIG. 3 depicts a flow chart of a process for making MFS device 60. The process shall be discussed in terms of the embodiments of FIGS. 1 and 2, but those skilled in the art will understand its applicability to other embodiments.

In step P70, a silicon wafer is prepared as substrate 22 for the receipt of additional layers. A conventional water or solvent wash will suffice to clean substrate 22. Substrate 22 preferably contains n-doped or p-doped silicon, and can be doped as required according to conventional protocols known to those skilled in the art In most instances, substrate 22 will have a coating of an isolation layer, such as oxide layer 28, which is preferably formed by conventional methods including baking the wafer under oxygen in a diffusion furnace at a temperature ranging from about 500° C. to about 1100° C. A contact hole, e.g., hole 30, can be etched through layer 28 proximal to the region where device 60 is to be constructed. The etching of contact hole 30 and further doping of source/drain regions 24 and 26 occurs according to conventional protocols known to those skilled in the art. The etching of contact hole 30 and the use of oxide layer 28 are described as a preferred embodiment, but the construction of device 60 does not require these features as essential elements.

Step P72 is a highly preferred but step that includes the formation of buffer layer 36. Silicon nitride is preferably formed by low pressure chemical vapor deposition with the substrate heated to a temperature ranging from 700° C. to 1000° C. Alternatively, silicon nitride can be sputtered to a preferred thickness ranging from 100 to 200 Å, after which the substrate can be heated or annealed under nitrogen. The preferred anneal profile includes a duration ranging from two hours to thirty minutes at a maximum anneal temperature of about 600° C. including a five minute ramp up to the maximum temperature as well as a five minute ramp down. Yet another alternative is to sputter the buffer layer from a target of source material. After cooling of the substrate, step P72 preferably includes capping the buffer layer 36 with a layer of silicon dioxide or spin-on glass if it is later desired to orient ferroelectric layer 38 by exposure to radiation.

Step P74 includes the preparation of a liquid precursor solution having a plurality of metal moieties in effective amounts for yielding a layered superlattice material upon thermal treatment of the solution. These solutions are preferably designed to yield respective perovskite-like metal oxide layers separated by bismuth oxide layers and having an average empirical formula according to Formula (1) above. These solutions are preferably formed of essentially anhydrous polyoxyalkylated metal complexes mixed with a compatible solvent. The precursors more preferably include at least three metals. The polarization performance of layer 38 will in large part derive form the type of precursor solution selected, the purity of the reagents selected, and the subsequent processing of the solution. Additional details pertaining to the production of these precursors will be provided below.

In step P76, the precursor solution from step P74 is applied to the substrate from step P72. The application is preferably conducted by dropping the liquid precursor solution at ambient temperature and pressure onto the uppermost surface of substrate 22 then spinning the substrate at from about 1500 RPM to 2000 RPM for about 30 seconds to remove any excess solution and leave a thin-film liquid residue. The most preferred spin velocity is 1500 RPM. Alternatively, the liquid precursor may be applied by a misted deposition technique, such as the technique described in copending application Ser. No. 07/993,380, which is hereby incorporated by reference herein to the same extent as though fully disclosed herein.

Step P78 preferably includes drying the liquid precursor film from step P76 on a hot plate at a temperature of from about 200° C. to 500° C. in a dry air atmosphere. The drying time and temperature should be sufficient to remove or calcine substantially all of the organic materials from the liquid thin film and leave a dried metal oxide residue. The drying time preferably ranges from about one minute to about thirty minutes. For single-stage drying, a 400° C. drying temperature over a duration of about two to ten minutes in air is most preferred. It is more preferred, however, to dry the liquid film in stepped intervals. For example, the film can be dried for five minutes at 260° C. and for five minutes at 400° C. Additionally, it is preferred to conclude the drying cycle with a brief heating interval at a temperature exceeding 700° C., e.g., using a tungsten-nickel lamp to heat the substrate to 725° C. for thirty seconds. The drying step P78 is essential in obtaining predictable or repeatable electronic properties in the final metal oxide crystal compositions. Drying is preferably conducted simultaneously with exposing the precursor film to UV radiation. UV drying will produce a layered superlattice material having a C-axis orientation with improved electrical properties. This C-axis orientation can improve the dielectric constant and leakage current values that are obtained from the corresponding thin film of layered superlattice material.

In step P80, if the dried film from step P78 is not of the desired thickness, then steps P76, P78, and P80 are repeated until the desired thickness is attained. A thickness of about 1800 Å to 2000 Å typically requires two coats of a 0.130M to 0.200M precursor solution under the parameters disclosed herein.

In step P82, the dried precursor residue from step P80 is annealed to form the layered superlattice material of layer 38. This annealing step is referred to as the first anneal to distinguish it from other annealing steps, however, it should be understood that other anneal steps can occur prior to this "first anneal." For example, steps P70 and P72 each may include numerous annealing steps. In step P82, the substrate 22 including the dried precursor residue of step P80 heated in a diffusion furnace under an oxygen atmosphere to a temperature ranging from 450° C. to 1000° C. for a time ranging from thirty minutes to two hours. Step P82 is more preferably conducted at a temperature ranging from 600° C. to 800° C., with the most preferred anneal temperature being about 600° C. for eighty minutes. The first anneal of step P82 preferably occurs in a push/pull process including five minutes for the "push" into the furnace and five minutes for the "pull" out of the furnace. The indicated anneal times include the time that is used to create thermal ramps into and out of the furnace.

In a commercial manufacturing process, it will be advantageous to provide careful control of all annealing temperatures and times for purposes of providing consistent and reproducible results.

In step P84, top electrode 40 is preferably deposited by sputtering platinum atop ferroelectric layered superlattice layer 28.

The device is then patterned in step P86 by a conventional photolithograpy technique, e.g., one including the application of a photoresist followed by ion etching lithography in step P84. This patterning preferably occurs before the second anneal of step P88 so that the fourth anneal will remove patterning stresses from the resultant integrated circuit (e.g., devices 20 and 60) and correct any defects that are created by the patterning procedure.

The second anneal of step, P88, is preferably conducted in like manner with the first anneal of step P82.

Finally, in step P90 the device is completed and evaluated. The completion may entail the deposition of additional layers, ion etching of contact holes, and other procedures, as will be understood by those skilled in the art. For example, these procedures could include the formation of contact holes 32 and 34, the deposition of leads 44 and 46, and the provision of layers 42, 48, and 50, to complete device 20. The final product may be sawed into separate units to separate a plurality of integrated circuit devices that have been simultaneously produced thereon.

A preferred general process for preparing the polyoxyalkylated metal precursors of step P74 is provided, in application Ser. No. 08/132,744 filed Oct. 6, 1993, which is hereby incorporated by reference herein to the same extent as though fully disclosed herein, and application Ser. No. 07/965,190, which is hereby incorporated by reference herein to the same extent as though fully disclosed herein. The processes preferably include reacting a metal with an alkoxide (e.g., 2-methoxyethanol) to form a metal alkoxide, and reacting the metal alkoxide with a carboxylate (e.g., 2-ethylhexanoate) to form a metal alkoxycarbox-ylate according to one of the generalized formulae:

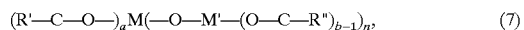

wherein M is a metal cation having an outer valence of (a +n) and M' is a metal cation having an outer valence of b, with M and M' preferably being independently selected from the group consisting of tantalum, calcium, bismuth, lead, yttrium, scandium, lanthanum, antimony, chromium, thallium, hafnium, tungsten, niobium, vanadium, zirconium, manganese, iron, cobalt, nickel, magnesium, molybdenum, strontium, barium, titanium, and zinc; R and R' are respective alkyl groups preferably having from 4 to 9 carbon atoms and R" is an alkyl group preferably having from 3 to 8 carbon atoms. The latter formula, which has a central —O—M—O—M'O— structure, is particularly preferred due to the formation in solution of at least 50% of the metal to oxygen bonds that will exist in the final solid metal oxide product.

The liquid precursor is preferably a metal alkoxide or metal carboxylate, and is most preferably a metal alkoxycarboxylate diluted with a xylene or octane solvent to a desired concentration. The use of an essentially anhydrous metal alkoxycarboxylate is particularly preferred due to the corresponding avoidance of water-induced polymerization or gelling, which can significantly reduce the shelf-life of solutions that contain alkoxide ligands. The presence of any hydrolysis-inducing moiety in solution is preferably avoided or minimized. Hydrolyzed precursors, such as conventional sol-gels, may also be utilized, but the increased solution viscosity tends to impair-the-unforrnity of thickness derived from the preferred spin-on application process, and the quality of the hydrolyzed solution tends to degrade rapidly with time. As a consequence, made-ready hydrolyzed gels increasingly yield poor quality metal oxide films of inconsistent quality over a period of time. The preferred method permits the preparation of precursor solutions well in advance of the time that they are needed.

The precursor solutions may be designed to yield corresponding layered superlattice materials or perovskites, with the understanding that the formation of oxygen octahedra structures is thermodynamically favored where possible. Generally, in terms of either the perovskite-like octahedral structure or the perovskite octahedral structure, equivalent substitutions may be made between metal cations having substantially similar ionic radii, i.e. radii that vary no more than about 20% at the respective lattice sites. These substitutions are made by adding the alternative metal moieties to the precursor solution.

The preferred ingredients of the precursor solutions include the preferred metals of the desired perovskite or layered superlattice material in a stoichiometrically balanced combination according to the empirical formula. The A-site portion is preferably formed by reacting with an alcohol or carboxylic acid at least one A-site element selected from an A-site group consisting of Ba, Bi, Sr, Pb, La, Ca, and mixtures thereof. The B-site portion is preferably derived by reacting an alcohol or carboxylic acid with at least one B-site element selected from a B-site group consisting of Zr, Ta, Mo, W, V, Nb, and mixtures thereof.

The use of titanium as an equivalent radius B-site element, though possible, is less preferred in practice due to problems that derive from titanium diffusion into other integrated circuit components and point charge defects that arise from different valence states among the titanium ions. Even so, the exceptional dielectric performance and longevity of BST materials makes it worthwhile to accommodate the possibility of titanium diffusion. In the case of layered superlattice materials, there is also added a trivalent superlattice-generator metal, which is preferably bismuth. With heating, the bismuth content will spontaneously generate bismuth oxide layers in the layered superlattice materials, but an excess bismuth portion can also provide A-site elements for the perovskite-like lattice.

Figure 4:
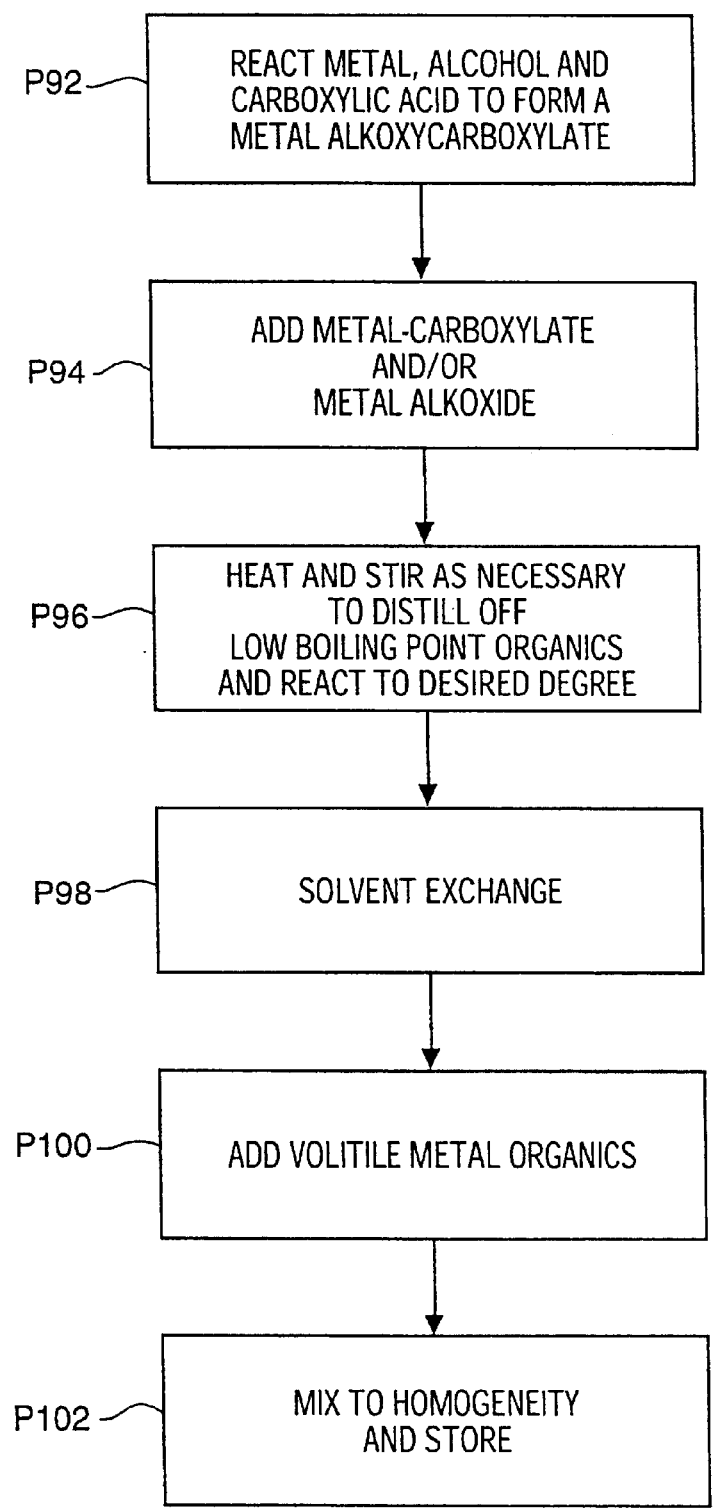
FIG. 4 is a process-flow chart diagram that describes the production of a liquid metal organic precursor for use in producing the layered superlattice material in the MIS device of FIG. 1.

FIG. 4 depicts a flow chart of a generalized process according to the present invention for providing a liquid precursor solution to be used in step P74. The word "precursor" is often used ambiguously in this art. It may mean a solution containing one metal that is to be mixed with other materials to form a final solution, or it may mean a solution containing several metals made-ready for application to a substrate. In this discussion we shall refer to the made-ready type of precursor as a "precursor," unless a different meaning is clear from the context. In intermediate stages the solution may be referred to as the "pre-precursor."

The preferred generalized reaction chemistry for the formation of liquid solutions of metal alkoxides, metal carboxylates, and metal alkoxycarboxylates for use in producing the initial metal precursor portions is as follows:

alkoxides—$M^{+n}+nR-OH \rightarrow M(-O-R)_n+n/2H_2$  (8)

carboxylates—$M^{+n}+n(R-COOH) \rightarrow M(-OOC-R)_n+n/2H_2$  (9)

alkoxycarboxylates—$M(-O-R')_n+bR-COOH+heat \rightarrow$
$(R'-O-)_{n-b}M(-OOC-R)_b+bHOR$,  (10)

where M is a metal cation having a charge of n; b is a number of moles of carboxylic acid ranging from 0 to n; R' is preferably an alkyl group having from 4 to 15 carbon atoms and R is preferably an alkyl group having from 3 to 9 carbon atoms.

In step P92 a first metal, indicated by the term M in the equations above, is reacted with an alcohol and a carboxylic acid to form a metal-alkoxycarboxylate pre-precursor. The process preferably includes reacting a metal with an alcohol (e.g., 2-methoxyethanol) to form a metal alkoxide according to Equation (8), and reacting the metal alkoxide with a carboxylic acid (e.g., 2-ethylhexanoic acid) to form a metal alkoxycarboxylate according to Equation (10). A reaction according to Equation (9) is also observed in the preferred mode when the unreacted metal is simultaneously combined with the alcohol and the carboxylic acid. The simultaneous reactions are preferably conducted in a reflux condenser that is heated by a hot plate having a temperature ranging from about 120° C. to about 200° C. over a period of time ranging from one to two days to permit substitution of the alkoxide moieties by carboxylate ligands. At the end of the initial one to two day reaction period, the reflux condenser is preferably opened to atmosphere, and the solution temperature is monitored to observe a fractional distillation plateau that indicates the substantial elimination of all water and alcohol portions from the solution, i.e., a plateau exceeding at least about 100° C., at which time the solution is removed from the heat source. Distillation to atmospheric pressure is more preferably is conducted to a temperature of at least 115° C., and most preferably to a temperature of about 123° C. to 127° C.

In the above equations, the metal is preferably selected from the group consisting of tantalum, calcium, bismuth, lead, yttrium, scandium, lanthanum, antimony, chromium, thallium, hafnium, tungsten, vanadium, niobium, zirconium, manganese, iron, cobalt, nickel, magnesium, molybdenum, strontium, barium, titanium, vanadium, and zinc. Alcohols that may be used preferably include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Carboxylic acids that may be used preferably include 2-ethylhexanoic acid, octanoic acid, and neodecanoic acid, preferably 2-ethyihexanoic acid.

The reactions of step P92 and subsequent steps are preferably facilitated by the use of a compatible solvent. Solvents that may be used include xylenes, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2- vethixyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, 3-pentanol, toluene, ethylbenzene, and octane, as well as many others. These solvents preferably have boiling points exceeding that of water for purposes of distilling the precursor to eliminate water therefrom prior to application of the precursor to a substrate. The cosolvents should be miscible with one another and may be compatibly mixed in differing proportions, especially between polar and apolar solvents, as needed to fully solubilize the. precursor ingredients. Xylenes and octane are particularly preferred apolar solvents, and n-butyl acetate is a particularly preferred polar cosolvent.

Portions of step P92 can be skipped in the event that intermediate metal reagents can be obtained in research grade purity. For example, where tantalum isobutoxide is available, it will only be preferred to substitute the isobutoxide moiety with an acceptable carboxylate ligand by reacting the metal alkoxide with a carboxylic acid such as 2-ethylhexanoic acid according to Equation (10).

In a typical second step, P94, a metal-carboxylate, a metal-alkoxide or both may be added to the metal-alkoxycarboxylate in effective amounts to yield an intermediate precursor having a stoichiometrically balanced mixture of superlattice-forming metal moieties that is capable of yielding a solid metal oxide for layer 26. At this time the mixture will preferably exclude bismuth compounds which, if needed, will be added later due to their relative thermal instability. Any of the metals listed above may be reacted with any of the carboxylic acids listed above to form the metal carboxylate, while any of the metals listed above may be reacted with any of the alcohols may form the alkoxide. It is particularly preferred to conduct this reaction in the presence of a slight excess amount of carboxylic acid for purposes of partially substituting alkoxide ligands with carboxylate ligands.

In step P96 the mixture of metal-alkoxycarboxylates, metalarboxylates and/or metal-alkoxides is heated and stirred as necessary to form. metal-oxygen-metal bonds and boil off any low-boiling point organics that are produced by the reaction. According to a generalized reaction theory, if a metal-alkoxide is added to the metal-alkoxycarboxylate, and the solution is heated, the following reactions occur:

$(R-COO-)_xM(-O-C-R')_a+M'(-O-C-R'')_b \rightarrow$
$(R-COO-)_xM-O-M'(-O-C-R'')_{b-1})_a+aR'-C-O-C-R''$  (11)

$(R-COO-)_xM(-O-C-R')_a+xM'(-O-C-R'')_b \rightarrow (R'-C-O-)_aM(-O-M'(-O-C-R'')_{b-1})_x+xR-COO-C-R''$  (12)

where M and M' are metals; R and R' are defined above; R" is an alkyl group preferably having from about zero to sixteen carbons; and a, b, and x are integers denoting relative quantities of corresponding substituents corresponding to the respective valence states of M and M'. Generally the reaction of Equation (11) will occur first since metal alkoxides react more readily than metal carboxylates. Thus, ethers having low boiling points are generally formed. These ethers boil out of the pre-precursor to leave a final product having a reduced organic content and the metal-oxygen-metal bonds of the final desired metal oxide already partially formed. If the heating is sufficient, some of the reaction (12) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

Step P96 is in essence a distillation to eliminate volatile moieties from solution as the reactions of equations (11) and (12) proceed. The elimination of volatile moieties from solution drives the reactions to completion, i.e., a high rate of efficiency. The elimination of volatile moieties from solution also serves to prevent film cracking and other defects that, otherwise, can be associated with the presence of volatile moieties in solution. Accordingly, the progress of reactions (11) and (12) can be monitored by the rate of solution heating as well as the volume of fluid exiting the solution. It is preferred to heat the solution to a boiling point plateau of at least 115° C., more preferably to 120° C., and most preferably from 123° C. to 127° C.

If a metal-carboxylate is added to the metal-alkoxycarboxylate and the mixture is heated, the following reaction occurs:

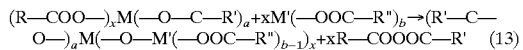

$$(R-COO-)_xM(-O-C-R')_a + xM'(-OOC-R")_b \rightarrow (R'-C-O-)_aM(-O-M'(-OOC-R")_{b-1})_x + xR-COOOC-R' \quad (13)$$

where R—COOOC—R' is an acid anhydride, and the terms are as defined above. This reaction requires considerably more heat than do the reactions (11) and (12) above, and proceeds at a much slower rate.

In addition to the above reactions which produce metal-alkoxycarboxylates, reactions occur such as:

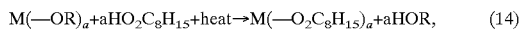

$$M(-OR)_a + aHO_2C_8H_{15} + heat \rightarrow M(-O_2C_8H_{15})_a + aHOR, \quad (14)$$

where the terms are as defined above. This reaction, with heating in the presence of excess carboxylic acid, substitutes the alkoxide part of the intermediate metal-alkoxycarboxylate to form a substantially full carboxylate; however, it is now believed that a complete substitution of the alkoxides by the carboxylates does not occur with the parameters as disclosed herein. Full substitution of the carboxylates requires significantly more heating, and even then may not readily occur.

At the end of step P96, it is preferable to have formed in solution at least 50% of the metal to oxygen bonds of the metal oxide layer 26. The reactions are preferably conducted in a vessel that is open to atmospheric pressure and is heated by a hot plate preferably having a temperature ranging from about 120° C. to about 200° C. until the solution temperature is monitored to observe a fractional distillation plateau that indicates the substantial elimination of all water, alcohol, ether, and other reaction byproduct portions from the solution, i.e., a plateau at least exceeding 100° C. At this time, extended refluxing can produce a potentially undesirable amount of an ester or acid anhydride byproduct that is often difficult to remove from the solution by fractional distillation. The potential complication of an excessive acid anhydride concentration can be entirely avoided by adding only metal carboxylates in step P94 to eliminate a possible need for refluxing the solution.

Step P98 is an optional solvent exchange step. The use of a common solvent in a variety of precursor solutions is advantageous due to the predictability of fluid parameters such as viscosity and adhesion tension, which influence the thickness of the liquid precursor film after it is applied to a substrate. These fluid parameters also affect the quality and the electrical performance of the corresponding metal oxide film after annealing of the dried precursor residue. In step P98, the standard solvent, which is preferably xylenes or n-octane, is added in an amount that is appropriate to adjust the intermediate precursor to a desired molarity of superlattice ingredients. This molarity preferably ranges from about 0.100M to about 0.400M in terms of the empirical formula for the metal oxide material, and is most preferably about 0.130M to 0.200M in terms of moles of metal oxide material that may be formed from a liter of solution. After the addition of the standard solvent, the solution is heated to a temperature that is sufficient to distill away any non-standard solvents and leave a solution having the desired molarity.

Step P100 is preferably used only in the case of precursors for layered superlattice materials that include bismuth. Bismuth ($Bi^{3+}$) is the most preferred superlattice-generator element, and the bismuth preprecursor will most preferably be bismuth tri-2-ethylhexanoate. The addition of bismuth pre-precursors subsequent to the heating of step P96 is preferred due to the relative instability of these pre-precursors, i.e., substantial heating could disrupt coordinate bonds with potential deleterious effects upon the ability of the solution to yield superior thin-film metal oxides. It should be understood that step P100 is optional in the sense that bismuth pre-precursors can often be added in any of steps P92 and P96 without problems.

Special problems exist with regard to the potential for bismuth volatilization during heating of the precursor solution and, especially, during high temperature annealing of the dried precursor residue in forming a layered superlattice material of the desired stoichiometric proportions. Accordingly, in step P100, it is preferred to add from about 5% to about 15% excess bismuth for purposes of compensating the precursor solution for anticipated bismuth losses. At annealing temperatures ranging from about 600° C. to about 850° C. for a period of about one hour, this excess bismuth moiety in the precursor solution will typically range from 5% to 15% of the amount that is required for a stoichiometrically balanced layered superlattice product. In the event that the excess bismuth is not fully volatilized during the formation of a metal oxide product, the remaining excess bismuth moiety can act as an A-site material and, thus, induce point defects in the resulting layered superlattice crystal.

In step P102, the solution is mixed to substantial homogeneity, and is preferably stored under an inert atmosphere of desiccated nitrogen or argon if the final solution will not be consumed within several days or weeks. This precaution in storage serves to assure that the solution is kept essentially water-free and avoids the deleterious effects of water-induced polymerization, viscous gelling, and precipitation of metallic moieties that water can induce in alkoxide ligands. Even so, the desiccated inert storage precaution is not strictly necessary when the precursor, as is preferred, primarily consists of metals bonded to carboxylate ligands and alkoxycarboxylates.

The exemplary discussion of the reaction process, as given above, above is generalized and, therefore, non-limiting. The specific reactions that occur depend on the metals, alcohols, and carboxylic acids used, as well as the amount of heat that is applied. Detailed examples will be given below.

The following non-limiting examples set forth preferred materials and methods for practicing the present invention.

EXAMPLE 1

Preparation of a Layered Superlattice Precursor Solution

The precursor ingredients of Table 1 were obtained from the indicated commercial sources and subdivided to obtain the portions shown.

TABLE 1

| Ingredient | Formula Weight (g/mol) | Grams | mmole | Molar Equiv. | Vendor |
|---|---|---|---|---|---|
| tantalum pentabutoxide $Ta(OC_4H_9)_5$ | 546.52 | 43.722 | 80.001 | 2.0000 | Vnipim |
| 2-ethylhexanoic acid | 144.21 | 72.884 | 504.01 | 12.800 | Aldrich |
| strontium | 87.62 | 3.5048 | 40.000 | 1.0000 | Strem |
| bismuth tri-2-ethyl-hexanoate (in naptha) $Bi(O_2C_6H_{11})_5$ | (765.50) | 66.752 | 87.201 | 2.1800 | Strem |

The tantalum pentabutoxide and 252.85 mmol portion of 2-ethylhexanoic acid were placed in a 250 ml Erlenmeyer flask with 40 ml of xylenes, i.e., about 50 ml xylenes for each 100 mmol of tantalum. The flask was covered with a 50 ml beaker to assist in refluxing and to isolate the contents from atmospheric water. The mixture was refluxed with magnetic stirring on a 160° C. hot plate for 48 hours to form a substantially homogenous solution including butanol and tantalum 2-ethylhexanoate. It should be understood that the butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation of the butanol fraction and water to eliminate the same from solution. The flask was removed from the hot plate when the solution first reached a temperature of 124° C., as a temperature indicator that substantially all butanol and water had exited the solution. The flask and its contents were cooled to room temperature.

The strontium and 50 ml of 2-methoxyethanol solvent were added to the cooled mixture for reaction to form strontium di-2-ethylhexanoate. A 100 ml portion of xylenes was added to the strontium mixture, and the flask and its contents were returned to the hot plate at 200° C. and refluxed for five hours with the 50 ml beaker again in place for reaction to form a predominant tantalum-strontium alkoxycarboxylate product according to Formula (6). The beaker was removed and the solution temperature was allowed to rise to 125° C. for elimination of the 2-methoxyethanol solvent from solution, as well as any ethers, alcohols, or water in solution. After removal from the heat source, the flask was permitted to cool to room temperature. The bismuth tri-2-ethylhexanoate was added to the cooled solution, which was further diluted to 200 ml with xylenes to form a precursor solution that was capable of forming 0.200 moles of $SrBi_{2.18}Ta_2O_{9.27}$ in the absence of bismuth volatilization.

Accordingly, this example indicates that step P92, i.e., the reaction of strontium metal, an alcohol, and a carboxylic acid, can occur in solution with the tantalum alkoxycarboxylate derived from tantalum pentabutoxide and 2-ethylhexanoic acid. Therefore, steps P92 and P94 can be conducted in a single solution, and in reverse of the FIG. 4 sequence.

The precursor formulation was designed to compensate for bismuth volatilization during a process of manufacturing solid metal oxides from the liquid precursor. Specifically, the $Bi_{2.18}$ moiety included an approximate nine percent excess (0.18) bismuth portion. After accounting for the anticipated bismuth volatilization during the forthcoming annealing steps, the precursor solution would be expected to yield a stoichiometric m=2 material according to Formula (3), i.e., 0.2 moles of $SrBi_2Ta_2O_9$ per liter of solution.

EXAMPLE 2

Formation of an MFIS Device Having A Silicon NITRIDE Buffer Layer

A device 60 was made using a precursor solution that was prepared according to Example 1. A conventional four inch diameter polycrystalline p-doped silicon wafer was rinsed with water and dried using a typical RCA water cleaning process. A silicon nitride layer was formed using low pressure chemical vapor deposition at 790° C. using a source of $SiH_2Cl_3$ and $NH_3$. The substrate including silicon nitride 36 was cooled to room temperature, and inserted into a spin-coating machine.

A 2 ml aliquot of the 0.2M $SrBi_2Ta_2O_9$ precursor from Example 1 was adjusted to a 0.13M concentration by the addition of 1.08 ml n-butyl acetate, and passed through a 0.2 μm filter. The substrate was spun at 1500 rpm in a conventional spin-coating machine. An eyedropper was used to apply precursor solution to the substrate for thirty seconds while spinning. The precursor-coated substrate was removed from the spincoating machine and dried in air for two minutes on a 140° C. hot plate. The substrate was dried in air for an additional four minutes on a second hot plate at 260° C. The substrate can be dried for an additional thirty seconds in oxygen at 725° C. using a HEATPULSE 410 tungsten-halogen lamp apparatus of the kind that may be purchased form AG Associates Inc. as the heat source. The tungsten halogen bulbs includes eight J208V bulbs (purchased from Ushio of Japan) for a total of 1200 W. The lamp heating profile includes a 100° C./second ramp up to 725° C. from room temperature. The spin-coating and drying procedure was repeated a second time to increase the overall thickness of layer 38 at the conclusion of Step P78.

The substrate (including dried precursor material in the position of layer 38) was annealed under an oxygen ($O_2$) atmosphere for eighty minutes at 800° C. in a diffusion furnace. This time included a five minute push into the furnace and a five minute pull out of the furnace.

Platinum metal was sputtered to a 2200 Å thickness using a DC magnetron. The substrate was patterned using a conventional negative resist mask and argon ion etching. After removal of the resist, the device was annealed under oxygen at 800° C. for forty minutes including a five minute push into the diffusion furnace and a five minute pull out of the furnace. This process may be repeated with alternative precursors.

EXAMPLE 3

Formation of an MFS Device Without a Silicon NITRIDE Buffer Layer

The process of Example 2 was identically conducted, except step P72, which includes deposition of the silicon nitride layer, was skipped. Thus, a device 60 was formed that lacked silicon nitride layer 36.

EXAMPLE 4

Capacitance Versus Voltage Measurements

Electronic measurements were conducted on the samples that were produced in Examples 2 and 3. Comparative capacitance versus voltage measurements were made using a Hewlett Packard 4275A LCR meter. The area of each square-patterned cell tested was 16296 $\mu m^2$. Testing was conducted at atmospheric pressure, a temperature of 17° C., and a voltage oscillation amplitude of 0.05 V having a 10,000 Hz frequency. The wait time between reverse direction measurements was two seconds.

Figure 5:
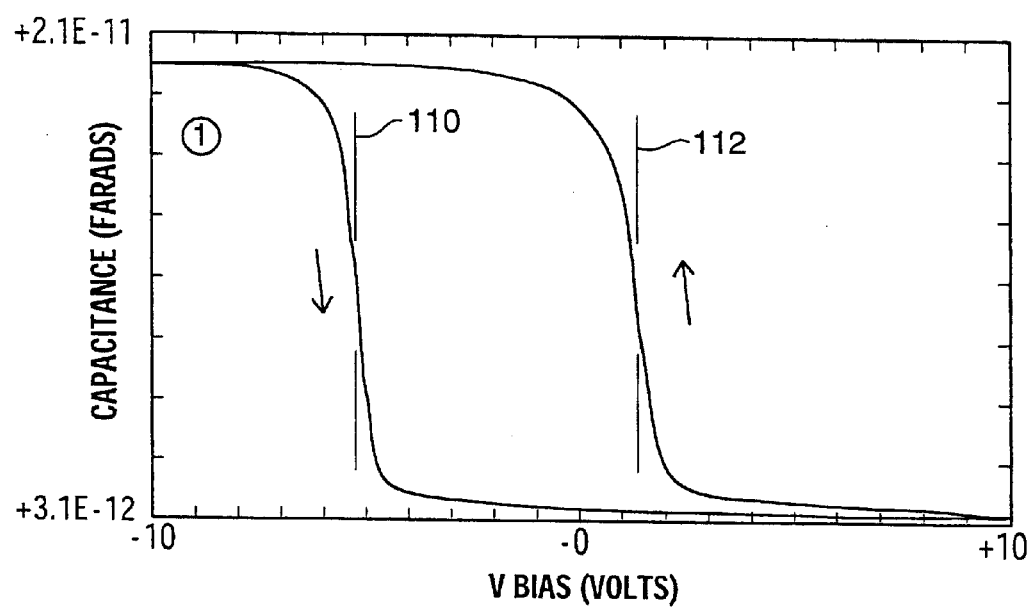
FIG. 5 depicts a plot of capacitance versus bias voltage including data obtained from an MIS device like that of FIG. 1.

FIG. 5 depicts the capacitance versus voltage results for the strontium bismuth tantalate device having a silicon nitride buffer layer that was produced according to the method of Example 2. Vertical lines 110 (along the positive switching curve) and 112 (along the negative switching curve) bisect the midpoints of their corresponding capacitance curves. The area between the positive and negative switching curves is a ferroelectric phenomenon that is known as a separation window. Lines 110 and 112 indicate that the separation window has a magnitude of 6.6 V between the midpoints of each curve. The respective curves also demonstrate a substantially vertical rise of $1.8 \times 10^{-11}$ farads between the maximum and minimum plateau for each curve. The steeply rising nature of the respective curves in combination with a wide separation between the curves indicates that the sample would make an excellent memory storage cell or gate in the FIG. 1 embodiment.

Figure 6:
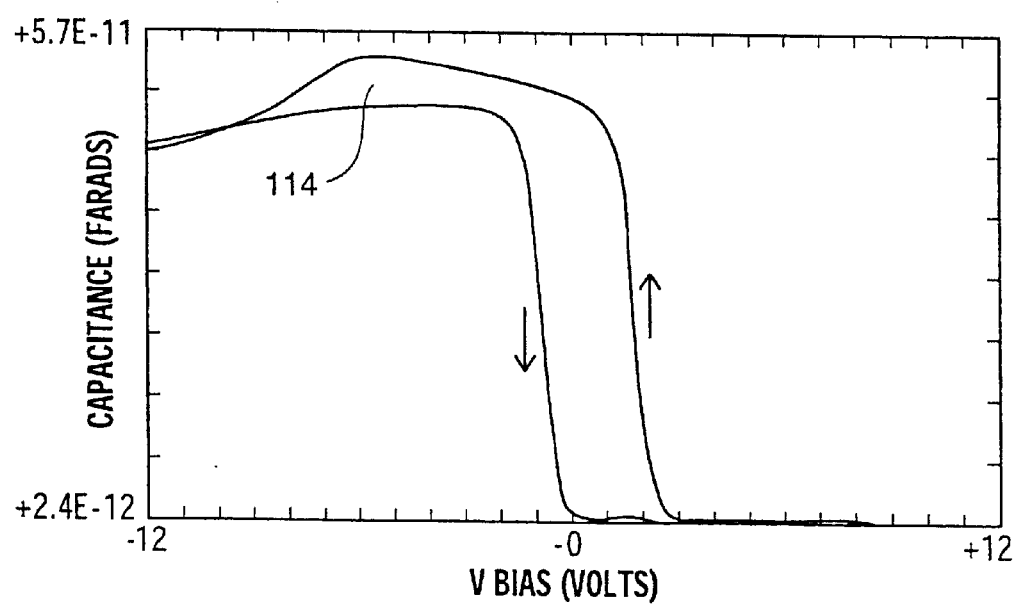
FIG. 6 is a capacitance versus voltage plot like that of FIG. 4, but includes data that was obtained from a MIS device which lacked the buffer layer as depicted in FIG. 1.

FIG. 6 depicts the capacitance versus voltage results for the sample derived from Example 3. The region of the curve denoted by the number 114 presents a swan-neck feature that is not found in the FIG. 5 curve. This necking feature broadens the required switching range to a thirteen volt interval, which makes the device less useful for applications that require full switching at lower voltages. The distortions in FIG. 6 as compared to FIG. 5 are due to the diffusion of bismuth, tantalum, and strontium moieties into the silicon substrate. The resultant boundary between the ferroelectric layer and the silicon layer, accordingly, has many trap levels and lacks electrical stability. Therefore, it is apparent from FIGS. 5 and 6 that the addition of a silicon nitride layer 36 has stabilized the electrical structure of device 60.

EXAMPLE 5

UV Orientation of Layered Superlattice Materials

The manufacturing process of Example 2 can be altered to include exposure to UV radiation during the precursor drying process (Step P78 of FIG. 3). The UV exposure serves to alter the crystalline orientation of the resultant layered superlattice material. A preferred UV source is the Danielson lamp. Measurements of the spectral output for the lamp identify a spectrum ranging from 180 nm to about 300 nm with an intensity of about 9 mW/cm$^2$ at 220 nm and 15 mW/cm$^2$ at 260 nm. These wavelengths selectively target the carbon to oxygen bonds in the precursor liquid for facilitation of the bond dissociation. The substrate is preferably exposed to UV radiation simultaneously with hot plate baking at 140° C. and 260° C. prior to being exposed to light from the tungsten-halogen lamp.

A device 60 was produced through Step P82 according to the method of Example 2, except that Step P78 of the process included exposure of the precursor to Danielson lamp UV radiation during drying. The manufacturing process provided an unpatterned device 60 that lacked platinum layer 40, but had a UV-oriented layered superlattice material.

The process of the above paragraph was repeated with the Danielson lamp turned off. The second sample was prepared in the absence of UV radiation, and produced a non-oriented layered superlattice material.

The respective oriented and non-oriented samples were subjected to X-ray diffraction measurements, which confirmed that the UV-processed sample had a C-axis orientation. Capacitance versus voltage measurements of each sample produced results that were similar to FIG. 5, indicting a wide separation and steep rate of switching. Leakage current was lower in the oriented sample, and the dielectric constant was lower. Thus, the oriented sampled had an improved duration of memory retention and a higher speed of operation as compared to the non-oriented sample.

EXAMPLE 6

UV Orientation on Different Substrates

The comparative study of Example 5 was repeated for other strontium bismuth tantalate samples that were formed on different substrates. These measurements determined whether the strontium bismuth tantalate could be oriented on other substrates besides silicon nitride. A precursor solution was prepared according to Example 1 for use on the respective substrates, and applied in direct contact with various substrate layers including n-Si, p-Si, and Si/SiO$_2$.

Figure 7:
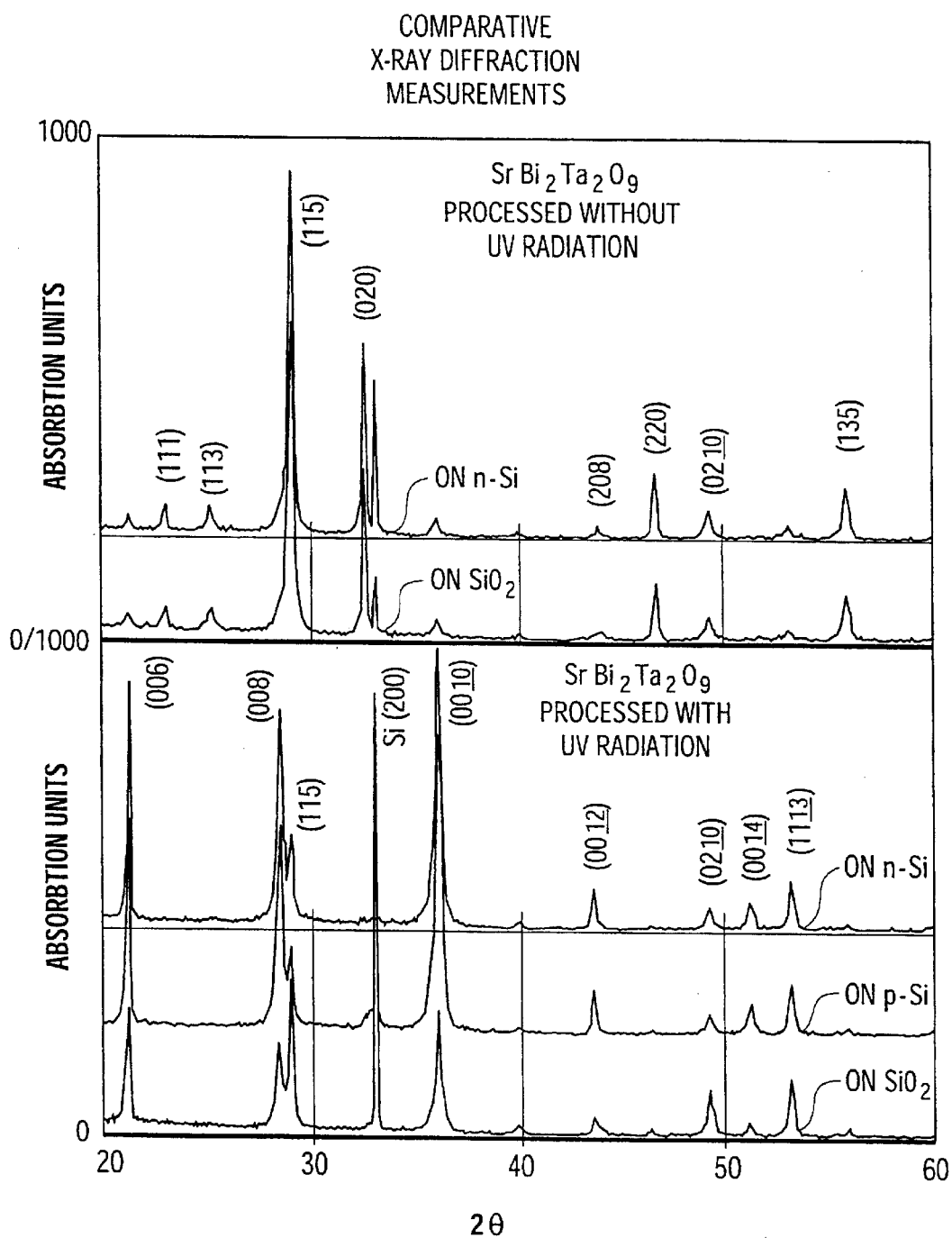
FIG. 7 depicts data from X-ray diffraction measurements that compare the crystal structure of nonoriented and UV-oriented layered superlattice material thin films.

FIG. 7 depicts the results of X-ray diffraction measurements that were performed on the respective samples. The upper two curves represent results from the nonoriented samples, and the bottom three curves represent results from the oriented samples. The Y-axis represents a uniform absorption count scale that has been adjusted to an arbitrary 0 to 1000 range for comparison of values between the oriented and nonoriented samples. Each curve is labeled with the type of substrate on which the SrBi$_2$Ta$_2$O$_9$ material was formed. The C-axis orientation of the UV-exposed samples is apparent, e.g., as by the substantially increased intensity level of peak (0,0,10) in the UV-exposed samples. This peak reflects only intensity values for the C-axis 10 position. FIG. 7 proves that UV radiation will orient ferroelectric layer 38 in the same manner on a variety of substrates.

Those skilled in the art will understand that the preferred embodiments, as described above, may be subjected to apparent modifications without departing from the true scope and spirit of the invention. Accordingly, the inventors hereby state their intention to rely upon the Doctrine of Equivalents for purposes of protecting their full rights in the invention.

What is claimed is:

1. A method of making a device for use in integrated circuits, said method comprising the steps of:

providing a semiconducting substrate having an exposed surface;

depositing a buffer layer comprising non-oxide material directly on said exposed surface;

forming a layered superlattice material on said buffer layer, said forming step including the step of mixing a liqiuid precursor solution to contain a plurality of metal moieties in effective amounts for yielding a layered superlattice material upon heating; and completing said device.

2. The method as set forth in claim 1 wherein said forming step includes applying said liquid precursor solution to form a thin film of said solution on said substrate.

3. The method as set forth in claim 1 wherein said forming step includes depositing said liquid precursor solution on said substrate to form a thin precursor film, and drying said film under exposure to ultraviolet radiation to yield a dried thin film.

4. The method as set forth in claim 3 including a step of annealing said dried thin film to yield a layered superlattice material.

5. A product produced according to the method of claim 4.

6. The method as set forth in claim 1 wherein said depositing step includes chemical vapor deposition of a silicon nitride layer.

7. The method as set forth in claim 1 including a step of making an oxide layer atop said buffer layer prior to sail forming step.

* * * * *